United States Patent
Pham et al.

(10) Patent No.: US 6,826,829 B2
(45) Date of Patent: Dec. 7, 2004

(54) METHOD FOR ATTACHING A DIE WITH A LOW MELTING METAL

(75) Inventors: Cuong Van Pham, San Diego, CA (US); Jay DeAvis Baker, Dearborn, MI (US); Mohan R. Paruchuri, Canton, MI (US); Prathap Amervai Reddy, Farmington Hills, MI (US); Vivek Amir Jairazbhoy, Farmington Hills, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 308 days.

(21) Appl. No.: 10/093,153

(22) Filed: Mar. 7, 2002

(65) Prior Publication Data

US 2003/0167630 A1 Sep. 11, 2003

(51) Int. Cl.[7] ................................................. H05K 3/34
(52) U.S. Cl. ............................ 29/840; 29/832; 29/841; 29/855; 156/87; 257/667; 438/126
(58) Field of Search ......................... 29/832, 840, 841, 29/847, 855, 861; 438/112, 119, 127, 108, 126; 53/410, 411, 432, 433; 156/87; 174/260; 257/667, 778, 787

(56) References Cited

U.S. PATENT DOCUMENTS

| | | | |
|---|---|---|---|
| 4,323,914 A | | 4/1982 | Berndlmaier et al. ......... 357/82 |
| 4,851,972 A | * | 7/1989 | Altman ........................ 362/267 |
| 5,013,688 A | * | 5/1991 | Yamazaki et al. ............ 29/827 |
| 5,243,756 A | | 9/1993 | Hamburgen et al. .......... 29/841 |
| 5,405,808 A | | 4/1995 | Rostoker et al. ............. 437/209 |
| 5,568,684 A | | 10/1996 | Wong ........................... 29/840 |
| 5,663,106 A | | 9/1997 | Karavakis et al. ............ 29/841 |
| 5,780,928 A | | 7/1998 | Rostoker et al. ............. 257/713 |
| 5,824,568 A | | 10/1998 | Zechman ...................... 438/112 |
| 5,824,569 A | * | 10/1998 | Brooks et al. ............... 438/127 |
| 6,601,753 B2 | * | 8/2003 | Baker et al. ................ 228/219 |

* cited by examiner

*Primary Examiner*—Peter Vo
*Assistant Examiner*—Donghai D. Nguyen
(74) *Attorney, Agent, or Firm*—Brinks Hofer Gilson & Lione (57) ABSTRACT

A method for attaching an electronic die to a substrate is disclosed. Preferably, the method includes fixing the die to the substrate, interconnecting the electronic die to an at least one bonding pad on the substrate to form an electrical connection, coating the interconnects and the electronic die with an electrically insulating coating, and covering the electronic die with a low temperature melting metal. Thus, the method of the present invention improves the reliability of the electronic die.

14 Claims, 7 Drawing Sheets

METHOD FOR ATTACHING A DIE WITH A LOW MELTING METAL

TECHNICAL FIELD

The present invention relates to methods for attaching integrated circuit dies to substrates using low temperature solder.

BACKGROUND

Silicon dies having integrated circuits created therein are typically attached to a heat spreader or substrate. Wire bond is electrically fixed to the silicon die and bonding pad on the substrate to communicate electrical signals from the integrated circuits within the die to electronic circuits external to the die. The attachment of the silicon die to the substrate or heat spreader is of critical importance. The methods and materials used to attach the die to the substrate have a significant impact on the performance and reliability of the silicon die.

One prior art method for attaching the silicon die to the substrate utilizes high temperature solder material. While this method accomplishes its intended purpose, significant problems still exist. For example, attaching the silicon die with high temperature solder induces stresses in the die upon thermal cycling. These stresses are caused by the different coefficients of thermal expansion between the silicon die, solder, and substrate. Consequently, the induced stresses lead to early failure of the die.

Other methods for attaching the silicon die to the substrate to overcome the disadvantages stated above have been developed. For example, an improved method for attaching the silicon die utilizes low temperature solder. While this method for attaching the silicon die to the substrate or heat spreader eliminates the stresses induced in the die and thus significantly increases the die's life, significant problems still exist. For example, the use of this method creates voids and cracks in the solder material. The voids and cracks significantly increases thermal resistance in the solder material. Consequently, the increased thermal resistance raises the junction temperature and ultimately leads to premature failure of the silicon die.

Therefore, there is a need for a new and improved method for attaching a silicon die to a substrate. This new and improved method must reduce or eliminate thermal stresses in the silicon die and must increase the life in service of the silicon die.

SUMMARY

In accordance with an aspect of the present invention, a new and improved method for attaching silicon die to a substrate is provided. The method of the present invention creates a void-free attachment of the silicon die to the substrate. More specifically, in one embodiment a low temperature die attachment material (i.e., solder) is used to affix the silicon die to the substrate and in another embodiment a vacuum is used to hold the die against the die holder until the die is permanently fixed to the substrate.

In another embodiment of the present invention, a method for attaching an electronic die to a substrate is disclosed. Preferably, the method includes fixing the die to the substrate, interconnecting the electronic die to an at least one bonding pad on the substrate to form an electrical connection, coating the interconnects and the electronic die with an electrically insulating coating, and covering the electronic die with a low temperature melting metal. Thus, the method of the present invention improves the reliability of the electronic die.

In still another embodiment of the present invention, the die is temporarily fixed to the substrate using low temperature solder.

In still another embodiment of the present invention, the die is temporarily fixed to the die holder using a vacuum, until the die is permanently fixed to the substrate.

In yet another embodiment of the present invention, the substrate is filled with a heat dissipating material substantially covering the die.

In yet another embodiment of the present invention, the substrate is sealed with a cover after the heat dissipating material is deposited over the die.

Further aspects, features and advantages of the invention will become apparent from consideration of the following description and the appended claims when taken in connection with the accompanying drawings.

BRIEF DESCRIPTION OF THE DRAWINGS

FIG. 1b is a cross-sectional view of the die and substrate of FIG. 1a;

FIGS. 2b–e are a cross-sectional view through the die and substrate as indicated in FIG. 2a;

DETAILED DESCRIPTION

Figure 1A:
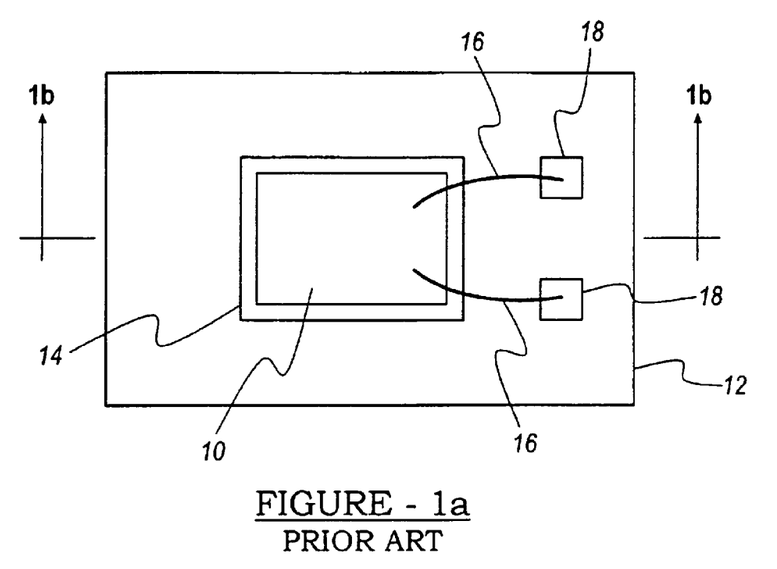
FIG. 1a is a top view of a die and substrate, wherein the die was attached to the substrate using prior art methods.
Figure 1B:
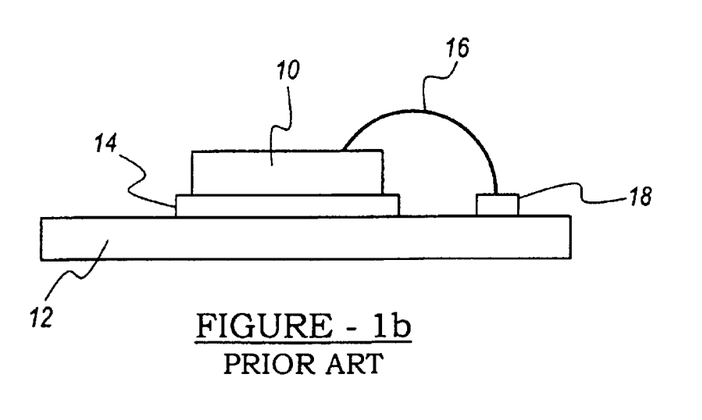

Referring now to FIGS. 1a and 1b, a top and cross-sectional views of a prior art system for attaching an integrated circuit die to a substrate is illustrated. In this prior art method and system, an integrated circuit die 10, typically made of silicon, is affixed to a substrate or heat spreader 12. The heat spreader may be copper or copper-Invar-copper. Conventionally, high temperature solder 14 is disposed between die 10 and substrate 12 to secure the die thereto. The high temperature solder is typically, 10% Sn-88% Pb-2% Ag or 95% Sn-5% Pb. Such high temperature solders have about a 300° C. melting temperature and no low creep under normal operating temperatures of 60 to 150° C.

After the die has been secured to substrate 12, wire bond 16 may be applied. Wire bond 16 is welded or similarly affixed at one end to die 10 and at another end to a bond pad 18. Wire bond 16 communicates electrical signals between die 10 and bond pad 18. Bond pad 18, as well known in the art, is in communication with electrical circuits and electronic devices external to die 10.

While high temperature solder works to affix die 10 to substrate 12 problems arise through the use of this material.

For example, high temperature solder 14 induces stresses in the die upon thermal cycling. The stresses are the result of the disparity in coefficients of thermal expansion between the die, solder, and substrate. A result of the induced stresses is premature failure of the die, by the creation of cracks in the electronic die module.

Another problem the present inventors have observed, arising during the attachment of the die to the substrate is air entrapment resulting in the creation of voids in the solder. The voids or trapped air in the solder increases the thermal resistance of the solder and thus increases the die operating temperature. The present invention, eliminates this problem and other problems.

With reference to FIGS. 2a–e, a plan and cross-sectional view of a die 10' mounted in a substrate 12' are illustrated. Substrate 12' in an embodiment of the present invention, includes an upstanding wall 32 extending from a bottom 34. Wall 32 which extends around the perimeter of bottom 34 together with bottom 34 define a cavity 36.

Figure 2A:
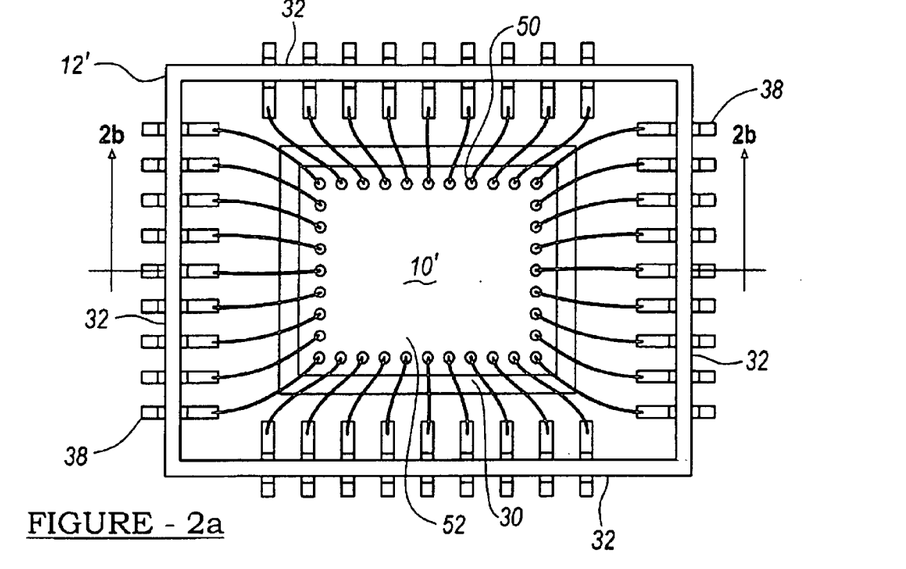
FIG. 2a is a top view of a die and substrate wherein the die is attached to the substrate using the system and method of the present invention.

A plurality of electrical connectors or tabs 38 are disposed within an upper end wall portion 40 of wall 32. Die 10' is electrically interconnected with a first tab end 42 by a wire bond 44. A second tab end 46 electrically interconnects die 10' prime with circuitry exterior of the substrate 12'.

Figure 2B:
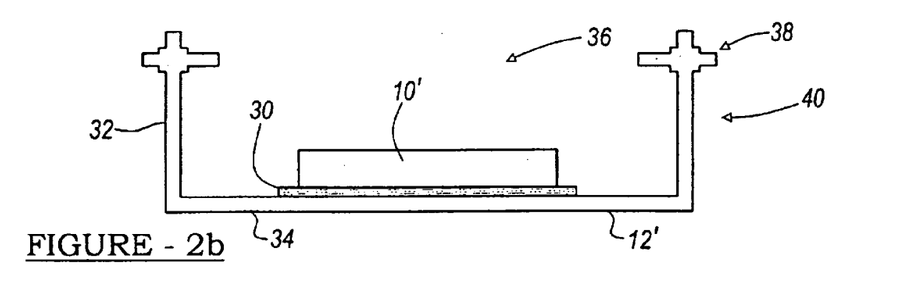
Figure 2C:
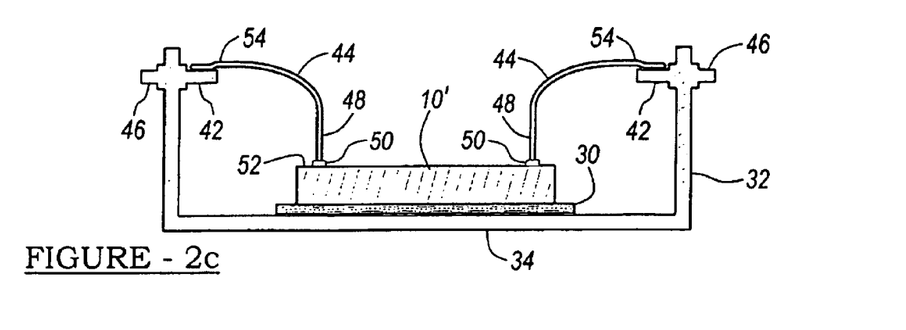

With continuing reference to FIGS. 2b through 2e a method for attaching die 10' to substrate 12' is illustrated, in accordance with the present invention. FIG. 2b is a cross sectional view through die 10' and substrate 12', as indicated in FIG. 2a. Once die 12' has been fixedly attached to bottom 34 of substrate 12', wire bond 44 may be welded at a first end 48 to die pads 50. Pluralities of bond pads 50 are etched on the top surface 52 of die 10'. A second end 54 of wire bond 44 is electrically connected to first tab end 42. After the wire bond 44 have been installed, die 10' and wire bond 44 are coated with an electrically insulating epoxy or other suitable material. Thus, there may be more than one die attached to the substrate 12' and after coating with the epoxy the die will be electrically isolated from each other.

Figure 2D:
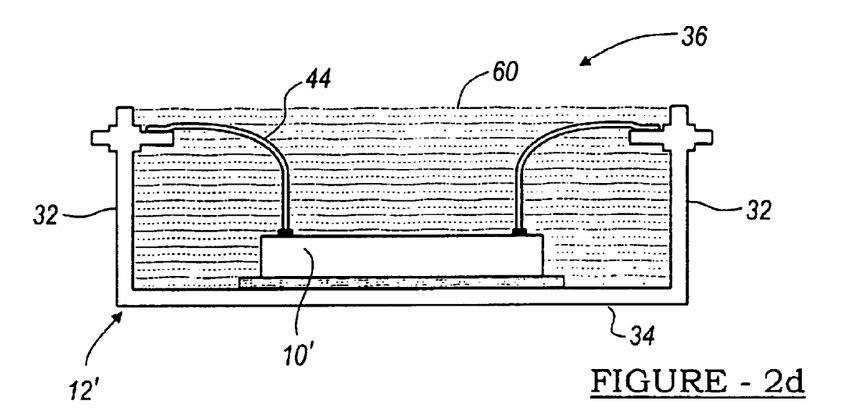
Figure 2E:
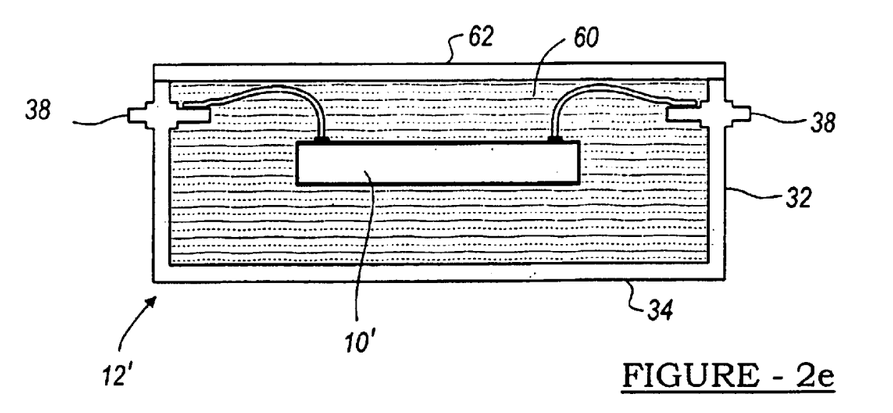

Referring now to FIG. 2d cavity 36 of substrate 12' is shown after being filled with a low temperature melting metal, such as low temperature solder 60. in accordance with the present invention. As die 10' is encapsulated with solder 60 air trapped within cavity 36 is forced out eliminating air entrapment or formation of void within the solder. Further, solder 60 acts as heat sink during transient conditions or operation. The mass of solder 60 absorbs the power dissipated by silicon die 10'. Solder 60 has a higher heat absorbing capacity as heat is absorbed during the phase change of the solder from solid to solidus is to liquid. Thus, essentially little to no stresses are induced either in solder material 60 or in die 10'. Therefore, this system and method of die attachment has a high thermal conductivity and significantly improves thermal dissipation in high power applications. Finally, in FIG. 2e a lid 62 is mated with wall 32 of substrate 12' to form an airtight container. Cover or lid 62 may be sealed with a vacuum or inert gas to expel air trapped within cavity 36.

Preferably, the low temperature solder is composed of low melting temperature alloys such as 82.7 percent by weight Bi, 17.3 percent by weight Ga in a Bi—Ga solder system or 57 percent by weight Bi-17 percent by weight Sn, 26 percent by weight In, or 52.5 percent by weight Bi, 15.5 percent by weight Sn and 32 percent by weight Pb.

Figure 3A:
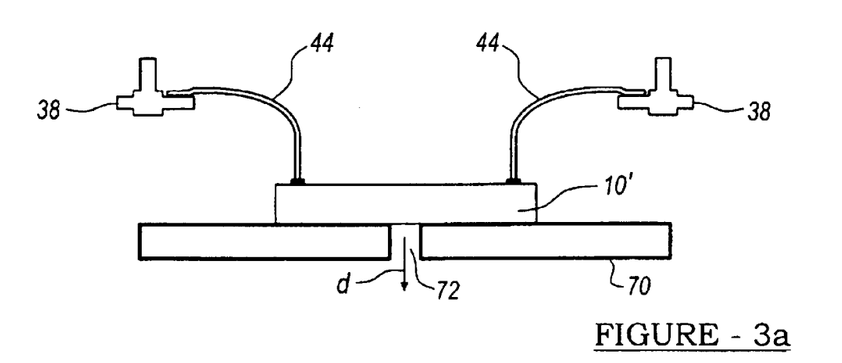
FIG. 3a is a top view of an alternative embodiment of the present invention, in accordance with the present invention.
Figure 3B:
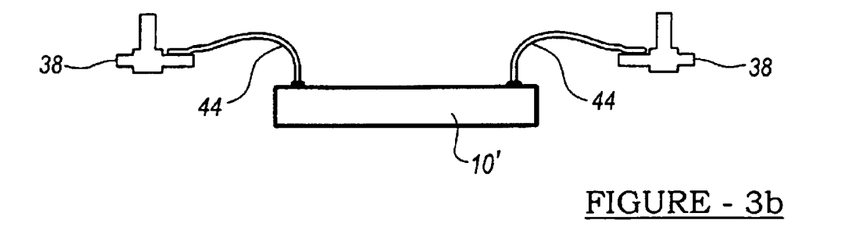
FIGS. 3b–d are cross-sectional views through the die and substrate of FIG. 3a as indicated in FIG. 3a, in accordance with the present invention.

Referring now to FIGS. 3a–3d, an alternate embodiment of the system and method for attaching a silicon die 10' or similar integrated circuit (or semiconductor material) to a substrate 12' is illustrated, in accordance with the present invention. Die 10' is placed in a vacuum hold down fixture 70 and a vacuum is applied through an orifice 72 in hold down fixture 70. The vacuum forces die 10' against hold down fixture 70 in a direction indicated by arrow d. Wire bond is then intereconnected between die 10' and circuit board connectors or tabs 38. As illustrated in FIG. 3b the die 10', wire bond 44, circuit tabs 38 assembly is removed from the hold down fixture. An epoxy or similar material is applied to the die and wire bond to create an insulating covering.

Figure 3C:
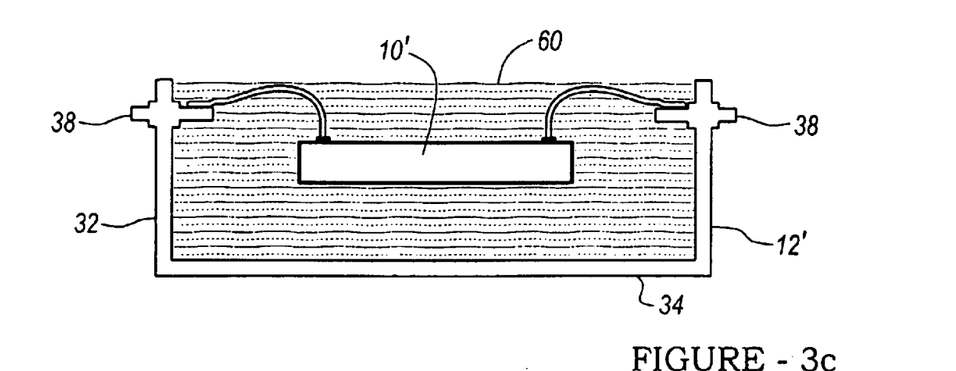

With reference to FIG. 3c, a low temperature mounting material 60 is deposited within a cavity 36 of substrate 12'. Solder material 60 totally covers and encapsulates die 10' and wire bonds 44. Thus, the die 10' is suspended within cavity 36 of substrate 12'.

Figure 3D:
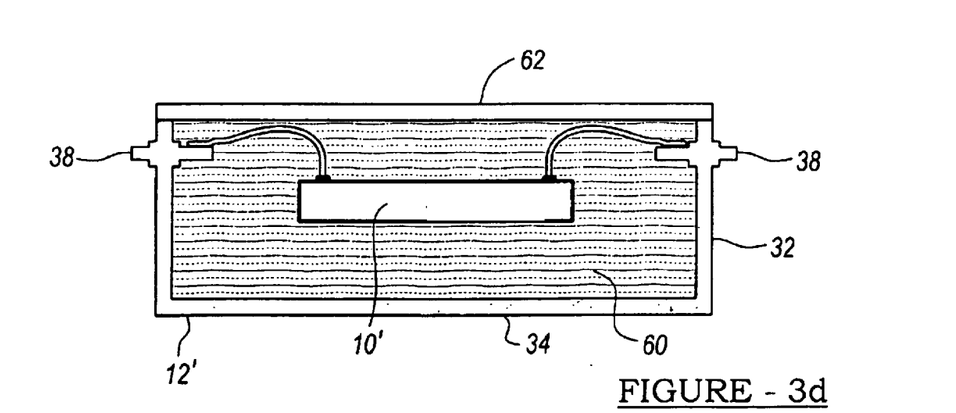

Referring now to FIG. 3d, a cross-sectional view of die 10' and substrate 12' is further illustrated. After cavity 36 is filled with solder material 60 such that die 10' and wire bonds 44 are totally covered by the solder material 60 a lid or top 62 is fixedly mounted to walls 32 of substrate 12'.

Figure 4:
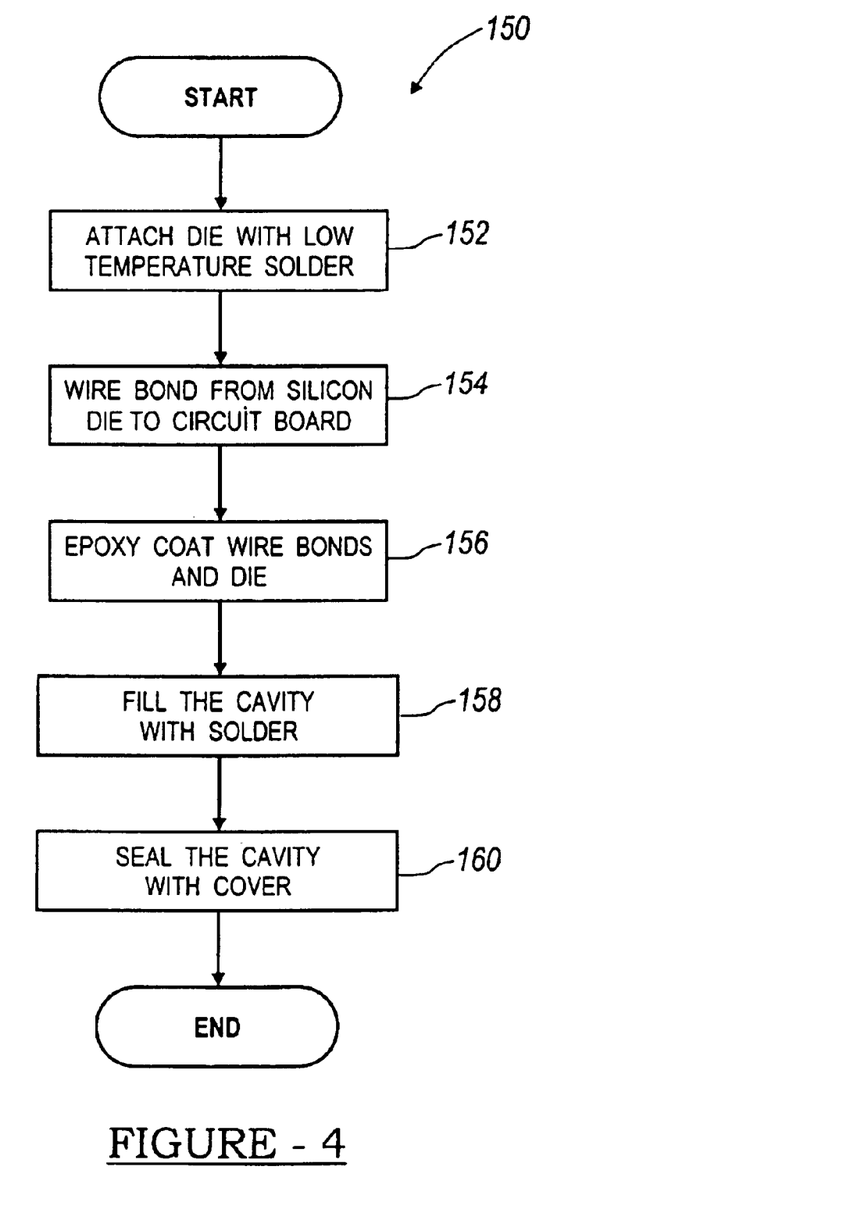
FIG. 4 is a flowchart illustrating a method for attaching a die to a substrate, in accordance with an embodiment of the present invention.

Referring now to FIG. 4, a first embodiment of the method for attaching die 10' to substrate 12' is illustrated in flow chart form, in accordance with the present invention. At block 152, die 10' is fixedly secured to substrate 12' by application of a low temperature melting material 30 (shown in FIGS. 2b and 2c) such as low temperature solder. Wire bond is then electrically connected from the die 10' to circuit board tabs or connectors, as represented at block 154. An epoxy coating or other electrically insulative material is applied to the wire bonds and die to electrically isolate the wire bonds and die from the surrounding environment. At block 158, the cavity containing die 10' is filled with a low temperature solder material until die 10' and wire bonds 44 are completely submerged in the solder. A lid or cover is mated with substrate 12' to seal cavity 36, as represented by block 160. Thus, the present invention provides a method for attaching a silicon die to a substrate to reduce stresses on the die.

Figure 5:
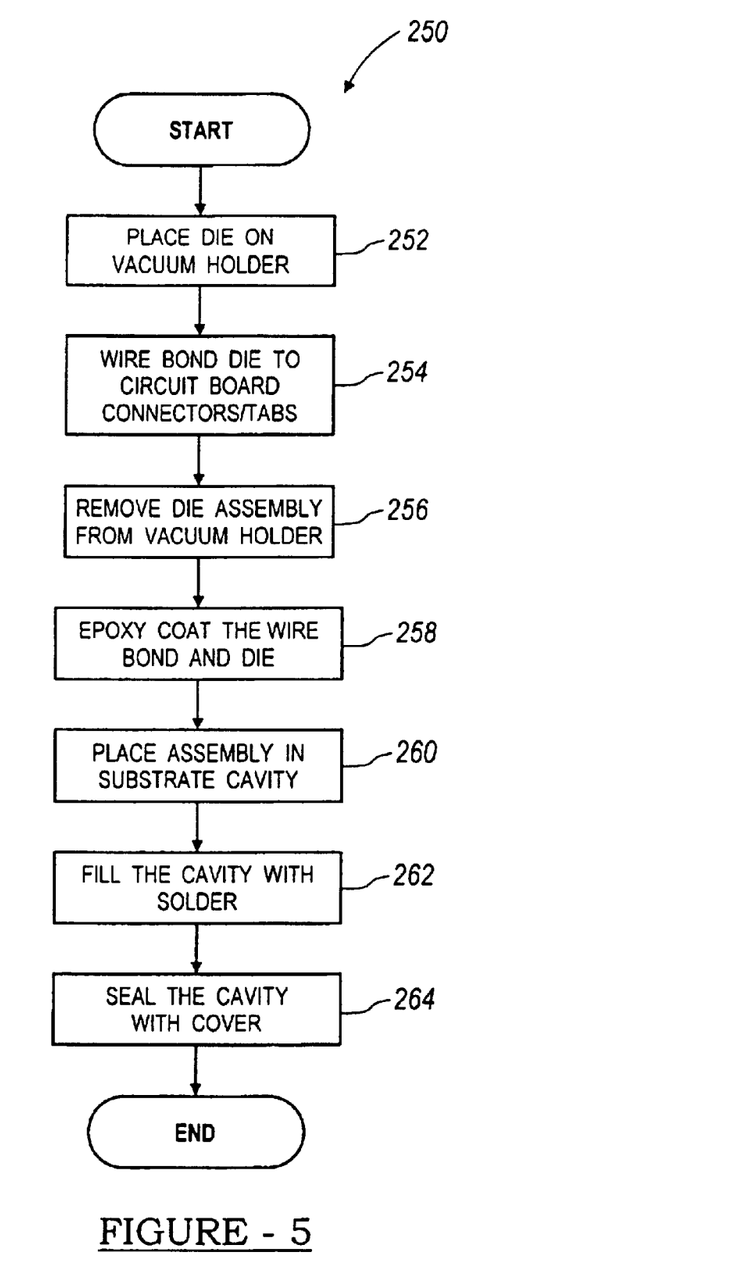
FIG. 5 is a flowchart illustrating an alternative method for attaching a die to a substrate, in accordance with an embodiment of the present invention.

Referring now to FIG. 5, an alternative method for attaching a die to a substrate is illustrated, in accordance with the present invention. Method 250 includes at block 252 placing die 10' on a vacuum holder for stabilizing the die and retaining it. At block 254 wire bonds are electrically connected to the die and to circuit board tabs or connectors to electrically interconnect the die to circuits external of the die. At block 256, the die and wire bond assembly is removed from the vacuum holder. An epoxy is applied to the wire bond and die assembly to coat the die and wire bond with an electrically insulating layer, as representative of block 258. At block 260, the wire bond and die assembly is placed in a cavity 36 of substrate 12'. The cavity 36 is then filled with a low temperature solder material until the entire wire bond and die assembly is covered, as represented by block 262. At block 264, a lid or cover is mated with substrate 12' to provide an air tight seal. Thus, the present invention provides an alternative method for attaching a die to a substrate to reduce stresses induced on the die.

The foregoing discussion discloses and describes a preferred embodiment of the invention. One skilled in the art will readily recognize from such discussion, and from the accompanying drawings and claims, that changes and modifications can be made to the invention without departing from the true spirit and fair scope of the invention as defined in the following claims.

What is claimed is:

1. A method for attaching and electrically interconnecting an electronic die to a substrate, the method comprising:

fixing the die to the substrate, the substrate having a wall and a bottom that define a cavity;

interconnecting the electronic die to an at least one bonding pad on the substrate to form an electrical connection;

coating the electrical connection and the electronic die with an electrically insulating coating;

covering the electronic die with a low temperature melting metal;

enclosing the cavity with a cover; and expelling air trapped from within the cavity by injecting a gas under the cover; and thereby forming an airtight seal between the cover and the cavity.

2. The method of claim 1 wherein fixing the die to the substrate further comprises applying a vacuum temporarily to a bottom surface of a die holder, in order to fix the die to the substrate.

3. The method of claim 1 wherein fixing the die to the substrate further comprises dispensing a bead of solder onto the substrate to secure the die to the substrate.

4. The method of claim 1 wherein covering the electronic die further comprises filling the cavity with the low temperature melting metal to cover the die.

5. The method of claim 1 wherein fixing the die to the substrate further comprises dispensing low temperature solder between the die and the substrate.

6. A method for attaching and electrically interconnecting an electronic die to a substrate, the method comprising:

holding the die against the substrate wherein the substrate has a wall and a bottom that define a cavity;

interconnecting the electronic die to at least one bonding pad on the substrate to form an electrical connection;

coating the electrical connection and the electronic die with an electrically insulating coating;

covering the electronic die with low a temperature solder enclosing the cavity with a lid; and expelling air trapped from within the cavity by injecting a gas under the lid; and thereby forming an airtight seal between the lid and the cavity.

7. The method of claim 6 wherein holding the die to the substrate further comprises applying a vacuum temporarily to a bottom surface of a die holder.

8. The method of claim 6 wherein holding the die to the substrate further comprises dispensing a bead of solder onto the substrate to secure the die to the substrate.

9. The method of claim 6 wherein covering the electronic die further comprises filling the cavity with the low temperature melting metal to cover the die.

10. The method of claim 6 wherein holding the die to the substrate further comprises the dispensing low temperature solder between the die and the substrate.

11. A method for attaching and electrically interconnecting an electronic die to a substrate, the method comprising:

applying a vacuum to a surface of the die to hold the die against the substrate wherein the substrate has a wall and a bottom that define a cavity;

interconnecting the electronic die to at least one bonding pad on the substrate to form an electrical connection;

coating the electrical connection and the electronic die with an electrically insulating coating;

covering the electronic die with low a temperature solder;

enclosing the cavity with a cover; and expelling air trapped from within the cavity by injecting a gas under the cover; and thereby forming an airtight seal between the cover and the cavity.

12. The method of claim 11 wherein holding the die to the substrate further comprises dispensing a bead of solder onto the substrate to secure the die to the substrate.

13. The method of claim 11 wherein covering the electronic die further comprises filling the cavity with the low temperature melting metal to cover the die.

14. The method of claim 11 wherein holding the die to the substrate further comprises the dispensing the low temperature melting metal between the die and the substrate.

* * * * *

UNITED STATES PATENT AND TRADEMARK OFFICE
CERTIFICATE OF CORRECTION

PATENT NO. : 6,826,829 B2
DATED : December 7, 2004
INVENTOR(S) : Cuong Van Pham et al.

It is certified that error appears in the above-identified patent and that said Letters Patent is hereby corrected as shown below:

Column 5,
Line 40, after "die with" delete "low a" and substitute -- a low -- in its place.

Column 6,
Lines 14 and 38, before "dispensing" delete "the".
Line 26, after "die with" delete "low a" and substitute -- a low -- in its place.

Signed and Sealed this

Third Day of May, 2005

JON W. DUDAS
*Director of the United States Patent and Trademark Office*